(12) United States Patent
Bolotin (10) Patent No.: US 6,532,395 B1
(45) Date of Patent: Mar. 11, 2003

(54) MANUFACTURING SYSTEM WITH FEEDER/PROGRAMMING/BUFFER SYSTEM

(75) Inventor: Lev M. Bolotin, Kirkland, WA (US)

(73) Assignee: Data I/O Corporation, Redmond, WA (US)

(*) Notice: Subject to any disclaimer, the term of this patent is extended or adjusted under 35 U.S.C. 154(b) by 0 days.

(21) Appl. No.: 09/418,732

(22) Filed: Oct. 15, 1999

(51) Int. Cl.[7] .................... G06F 19/00; G06F 7/00; H05K 3/30
(52) U.S. Cl. .................... 700/121; 700/112; 700/220; 29/832
(58) Field of Search .................... 700/95, 112, 121, 700/219, 220, 247; 29/825, 829, 832

(56) References Cited

U.S. PATENT DOCUMENTS

| | | | |
|---|---|---|---|
| 3,770,123 A | 11/1973 | Mraz | 209/107 |
| 3,910,416 A | 10/1975 | Payne | 209/74 M |
| 4,501,064 A | 2/1985 | DiNozzi et al. | 29/832 |
| 4,527,324 A * | 7/1985 | Dean et al. | 29/564.6 |
| 4,675,993 A | 6/1987 | Harada | 29/740 |
| 4,747,479 A | 5/1988 | Herman | 198/345 |
| 4,917,556 A | 4/1990 | Stark et al. | 414/217 |
| 5,209,132 A * | 5/1993 | Chayamichi et al. | 414/222.01 |
| 5,330,043 A * | 7/1994 | Stuckey | 198/346.2 |
| 5,695,071 A | 12/1997 | Ross et al. | 209/616 |
| 5,805,472 A * | 9/1998 | Fukasawa | 324/754 |
| 6,082,950 A | 7/2000 | Altwood et al. | 414/217 |
| 6,111,211 A | 8/2000 | Dziedzic et al. | 200/61.2 |
| 6,173,750 B1 * | 1/2001 | Davis et al. | 156/344 |
| 6,210,079 B1 * | 4/2001 | Teoh et al. | 406/12 |
| 6,229,323 B1 | 5/2001 | Tverdy et al. | 324/758 |
| 6,230,067 B1 * | 5/2001 | White | 29/593 |
| 6,241,459 B1 | 6/2001 | Canella et al. | 414/798 |

FOREIGN PATENT DOCUMENTS

| | | | |
|---|---|---|---|
| DE | 196 12 7813 A | 10/1997 | G01R/31/26 |
| DE | 198 01 978 A1 | 1/1998 | H05K/13/04 |
| EP | 0 517 439 A1 | 5/1992 | H05K/13/02 |
| JP | 58-56388 | 4/1983 | H05K/3/30 |
| JP | 63-293812 | 11/1988 | H01G/13/00 |
| JP | 03-205215 | 6/1991 | B65G/47/91 |
| JP | 10-249650 | 9/1998 | B23P/10/00 |
| JP | 11-083943 | 3/1999 | G01R/31/26 |
| JP | 2001-53499 | 2/2001 | H05K/13/04 |
| WO | WO 96/12396 | 4/1996 | H05K/13/08 |

OTHER PUBLICATIONS

BP–6500 In–Line Programming System brochure, BP Microsystems, Inc. 1999, 2 pages.
BP–6500 In–Line Programming System Data Sheet, BP Microsystems, Inc. 1999, 1 page.
"BP–6500 In–Line Programming & Fifth Generation Technology", BP Microsystems, Inc. 1999, 7 pages.

* cited by examiner

Primary Examiner—Leo Picard
Assistant Examiner—Elliot Frank
(74) Attorney, Agent, or Firm—Mikio Ishimaru (57) ABSTRACT

A circuit board manufacturing system is provided which includes a circuit board assembly line with a feeder/programming/buffer system. The feeder/programming/buffer system has a flexible feeder mechanism for receiving unprogrammed devices in a number of different manners, a programming mechanism for performing a programming operation on the unprogrammed devices at a high rate of speed, and an output buffer mechanism for providing the programmed devices to the circuit board assembly line.

36 Claims, 3 Drawing Sheets

MANUFACTURING SYSTEM WITH FEEDER/PROGRAMMING/BUFFER SYSTEM

CROSS-REFERENCE TO RELATED APPLICATIONS

The present application contains subject matter related to a concurrently filed U.S. Patent Application by Bradley Morris Johnson, Lev M. Bolotin, Simon B. Johnson, Carl W. Olson, Bryan D. Powell, and Janine Whan-Tong, entitled "FEEDER/PROGRAMMING/BUFFER OPERATING SYSTEM". The related application is assigned to Data I/O Corporation, is identified by Ser. No. 09/419,172, and is hereby incorporated by reference.

The present application also contains subject matter related to a concurrently filed U.S. Patent Application by Simon B. Johnson, George Leland Anderson, Lev M. Bolotin, Bradley Morris Johnson, Mark Sean Knowles, Carl W. Olson, and Vincent Warhol, entitled "FEEDER/PROGRAMMING/BUFFER CONTROL SYSTEM AND CONTROL METHOD". The related application is assigned to Data I/O Corporation, is identified by Ser. No. 09/418,901, and is hereby incorporated by reference.

The present application further contains subject matter related to a concurrently filed U.S. Patent Application by Lev M. Bolotin entitled "MANUFACTURING AND CARRIER SYSTEM WITH FEEDER/PROGRAMMING/BUFFER SYSTEM". The related application is assigned to Data I/O Corporation, is identified by Ser. No. 09/419,162, and is hereby incorporated by reference.

TECHNICAL FIELD

The present invention relates generally to a manufacturing system for electronic products, and more particularly to production of electronic circuit boards incorporating programmable integrated circuits.

BACKGROUND ART

In the past, certain operations of electronic circuit board assembly were performed away from the main production assembly lines. While various feeder machines and robotic handling systems would populate electronic circuit boards with integrated circuits, the operations related to processing integrated circuits, such as programming, testing, calibration, and measurement were performed in separate areas on separate equipment rather than being integrated into the main production assembly lines.

For example, in the programming of programmable devices such as electrically erasable programmable read-only memories (EEPROMs) and Flash EEPROMs, separate programming equipment was used which was often located in a separate area from the circuit board assembly lines. There were a number of reasons why programming was done off-line.

First, the programming equipment was relatively large and bulky. This was because of the need to accurately insert and remove programmable devices at high speeds into and out of programming sockets in the programmer. Since insertion and removal required relatively long traverses at high speed and very precise positioning, very rigid robotic handling equipment was required. This rigidity requirement meant that the various components had to be relatively massive with strong structural support members to maintain structural integrity and precision positioning of the pick and place system moving at high speeds. Due to the size of the programming equipment and the limited space for the even larger assembly equipment, they were located in different areas.

Second, a single high-speed production assembly system could use up programmed devices faster than they could be programmed on a single programming mechanism. This required a number of programming systems which were generally operated for longer periods of time in order to have a reserve of programmed devices for the production assembly systems. This meant that the operating times and the input requirements were different between the two systems.

Third, no one had been able to build a single system which could be easily integrated with both the mechanical and electronic portions of the production assembly systems. These systems are complex and generally require a great deal of costly engineering time to make changes to incorporate additional equipment.

A major problem associated with programming the programmable devices in a separate area and then bringing the programmed devices into the production assembly area to be inserted into the electronic circuit boards was that it was difficult to have two separate processes running in different areas and to coordinate between the two separate systems. Often, the production assembly line would run out of programmable devices and the entire production assembly line would have to be shut down. At other times, the programming equipment would be used to program a sufficient inventory of programmed devices to assure that the production assembly line would not be shut down; however, this increased inventory costs. Further problems were created when the programming had to be changed and there was a large inventory of programmed integrated circuits on hand. In this situation, the inventory of programmable devices would have to be reprogrammed with an accompanying waste of time and money.

While it was apparent that a better system would be desirable, there appeared to be no way of truly improving the situation. There were a number of apparently insurmountable problems that stood in the way of improvement.

First, the operating speeds of current production assembly lines so greatly exceeded the programming speed capability of conventional programmers that the programmer would have to have a much greater through-put than thought to be possible with conventional systems.

Second, not only must the programmer be faster than existing programmers, it would also have to be much smaller. The ideal system would integrate into a production assembly line, but would do so without disturbing an existing production assembly line or requiring the lengthening of a new production assembly line over that of the length without the ideal system. Further, most of these production assembly lines were already filled with, or designed to be filled with, various types of feeding and handling modules which provide limited room for any additional equipment.

Third, any programmer integrated with the production assembly line would apparently also have to interface with the control software and electronics of the production system software for communication and scheduling purposes. This would be a problem because production assembly line system software was not only complex, but also confidential and/or proprietary to the manufacturers of those systems. This meant that the integration must be done with the cooperation of the manufacturers, who were reluctant to spend engineering effort on anything but improving their own systems, or must be done with a lot of engineering effort expended on understanding the manufacturers' software before working on the programmer's control software.

Fourth, the mechanical interface between a programmer and the production equipment needed to be highly accurate for placing programmed devices relative to the pick-and-place handling equipment of the production assembly system.

Fifth, there are a large number of different manufacturers of production handling equipment as well as production manufacturing equipment. This means that the a large number of different production assembly line configurations would have to be studied and major compromises in design required for different manufacturers.

Sixth, the ideal system would allow for changing quickly between different micro devices having different configurations and sizes.

Seventh, the ideal system needed to be able to accommodate a number of different micro device feeding mechanisms including tape, tube, and tray feeders.

Finally, there was a need to be able to quickly reject micro devices which failed during the programming.

All the above problems seemed to render an effective solution impossible. This was especially true when trying to invent a comprehensive system which would be portable, allow "plug and play" operation with only external electric and air power, provide automated programming and handling, and be able to present programmed programmable devices to an automated production assembly line.

DISCLOSURE OF THE INVENTION

The present invention provides a micro device product manufacturing system which includes a production assembly line with a feeder/processing/buffer system. The feeder/processing/buffer system has a flexible feeder mechanism for receiving micro devices in a number of different manners, a processing mechanism for performing a processing operation on the micro devices at a high rate of speed, and an output buffer mechanism for providing the processed micro devices to the production assembly line on a continuous basis. The system substantially solves all the problems which previously faced such systems.

The present invention further provides a feeder/processing/buffer system which has a flexible feeder mechanism for receiving a plurality of micro devices, a processing mechanism for performing a processing operation on the micro devices, and an output buffer mechanism for providing the processed micro devices to a production assembly line. The system substantially solves all the problems which previously faced such systems.

The present invention further provides a feeder/processing/buffer system in which an input feeder mechanism for receiving micro devices, a processing mechanism for performing a processing operation on the micro devices, and an output buffer mechanism for providing the processed micro devices to a production assembly line, utilize linear operations to simplify design. The system substantially solves all the problems which previously faced such systems.

The present invention further provides a feeder/processing/buffer system in which a reduced number of components comprising an input feeder mechanism for receiving micro devices, a processing mechanism for performing a processing operation on the micro devices, and an output buffer mechanism for providing the processed micro devices to a production assembly line are aligned with each other and have primarily one degree of freedom to increase speed and productivity. The system substantially solves all the problems which previously faced such systems.

The present invention further provides a feeder/processing/buffer system in which an input feeder mechanism for receiving micro devices, a processing mechanism for performing a processing operation on the micro devices, and an output buffer mechanism for providing the processed micro devices to a production assembly line, utilize linear operations to simplify design. The system substantially solves all the problems which previously faced such systems.

The present invention further provides a circuit board manufacturing system which includes a circuit board assembly line with a feeder/processing/buffer system. The feeder/processing/buffer system has a flexible feeder mechanism for receiving unprogrammed devices in a number of different manners, a programming mechanism for performing a programming operation on the unprogrammed devices at a high rate of speed, and an output buffer mechanism for providing the programmed devices to the circuit board assembly line on a continuous basis. The system substantially solves all the problems which previously faced such systems.

The present invention further provides a feeder/processing/buffer system which has a flexible feeder mechanism for receiving a plurality of unprogrammed devices, a programming mechanism for performing a programming operation on the unprogrammed device, and an output buffer mechanism for providing the programmed devices to a circuit board assembly line. The system substantially solves all the problems which previously faced such systems.

The present invention further provides a feeder/processing/buffer system in which an input feeder mechanism for receiving unprogrammed devices, a programming mechanism for performing a programming operation on the unprogrammed integrated circuits, and an output buffer mechanism for providing the programmed devices to a circuit board assembly line, utilize linear operations to minimize system size. The system substantially solves all the problems which previously faced such systems.

The present invention further provides a feeder/processing/buffer system in which an input feeder mechanism for receiving unprogrammed devices, a programming mechanism for performing a programming operation on the unprogrammed devices, and an output buffer mechanism for providing the programmed devices to a circuit board assembly line, utilize rotary operations to minimize machine vibration. The system substantially solves all the problems which previously faced such systems.

The above and additional advantages of the present invention will become apparent to those skilled in the art from a reading of the following detailed description when taken in conjunction with the accompanying drawings.

BEST MODES FOR CARRYING OUT THE INVENTION

Figure 1:
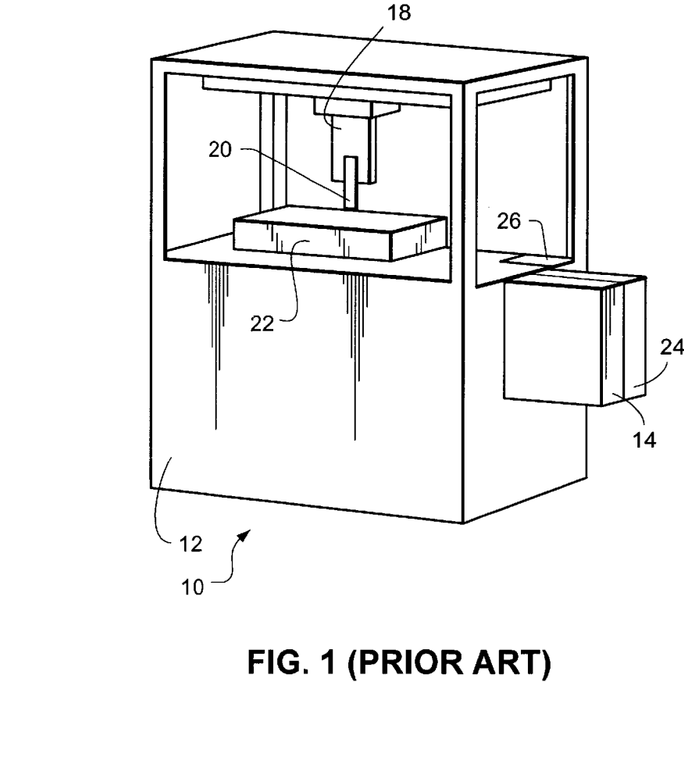
FIG. 1 (PRIOR ART) is an example of a prior art programming system.

Referring now to FIG. 1 (PRIOR ART), therein is shown a conventional processing system, such as a programming system 10 for programmable electronic devices. The programming system 10 is used as an example. The programming system 10 is extremely large and has a rigid frame 12 to which an input feeder 14 is attached. The input feeder 14 can be a tray, tray stacker, tube, tube stacker, or tape and reel, which supplies unprogrammed devices to the programming system 10.

A robotics handling system 18, which is capable of moving in an X-Y-Z and θ coordinate system (with X and Y being horizontal movements, Z being vertical, and θ being angular), carries a pick-and-place (PNP) head 20 for picking up the unprogrammed devices and moving them into a programming area 22 and inserting them into programming sockets not shown) in the programming system 10.

When the programming is complete, the robotics handling system 18 will move the PNP head 20 into place to remove the parts from the programming sockets and place them into an output mechanism 24. If the programmable devices could not be programmed, the robotics handling system 18 and the PNP head 20 will deposit the defective device into a reject bin 26.

The programming system 10 will continue to operate automatically until all the good devices in the input mechanism 14 are programmed and transferred to the output mechanism 24.

Figure 2:
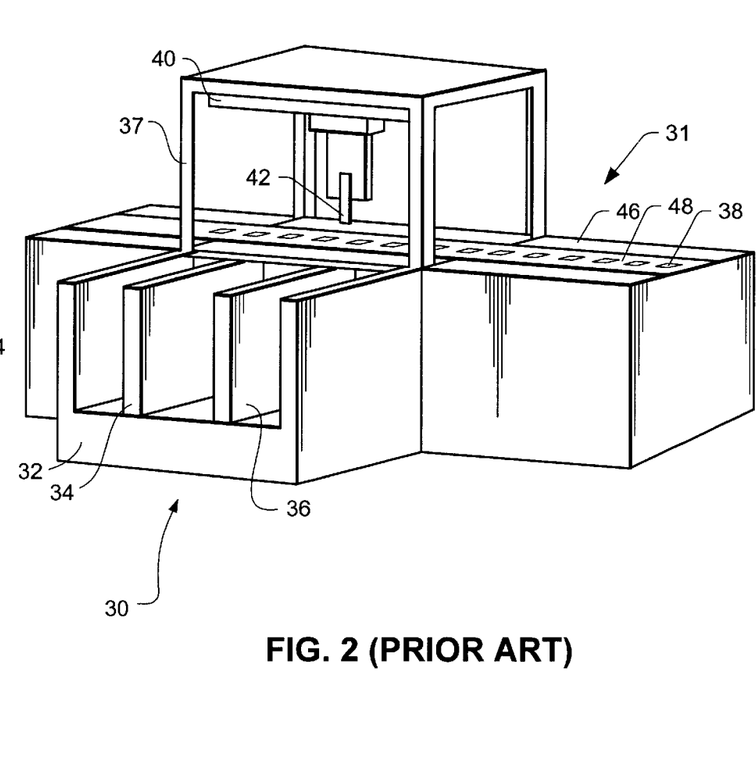
FIG. 2 (PRIOR ART) is an example of an electronic circuit board manufacturing line of the prior art which is part of the present invention.

Referring now to FIG. 2 (PRIOR ART), therein is shown a production assembly system 30 which includes an assembly line 31. The production assembly system 30 includes a feeder table 32 where various input feeders, such as the input feeders 34, are attached. Where programmed devices are involved, the output mechanism 24 from FIG. 1 (PRIOR ART) would be used as the input feeder 34. In FIG. 2 (PRIOR ART), two feeders 34 and 36 are shown installed, where each of the input feeders 34 and 36 could contain different types of programmable devices. The input feeders 34 and 36 can be trays, tray stackers, tubes, tube stackers, or tapes and reels.

The production assembly system 30 has a support frame 37 which carries a robotics handling system 40, which is capable of carrying a PNP head 42 along an X-Y-Z-θ coordinate system to take devices from the input feeders 34 and 36 and place them on printed circuit boards 38 as they are moved along a conveyor belt 48 which is mounted in assembly line frame 46. The input feeders 34 and 36 are located offset from the direction of movement of the conveyor belt 48.

Figure 3:
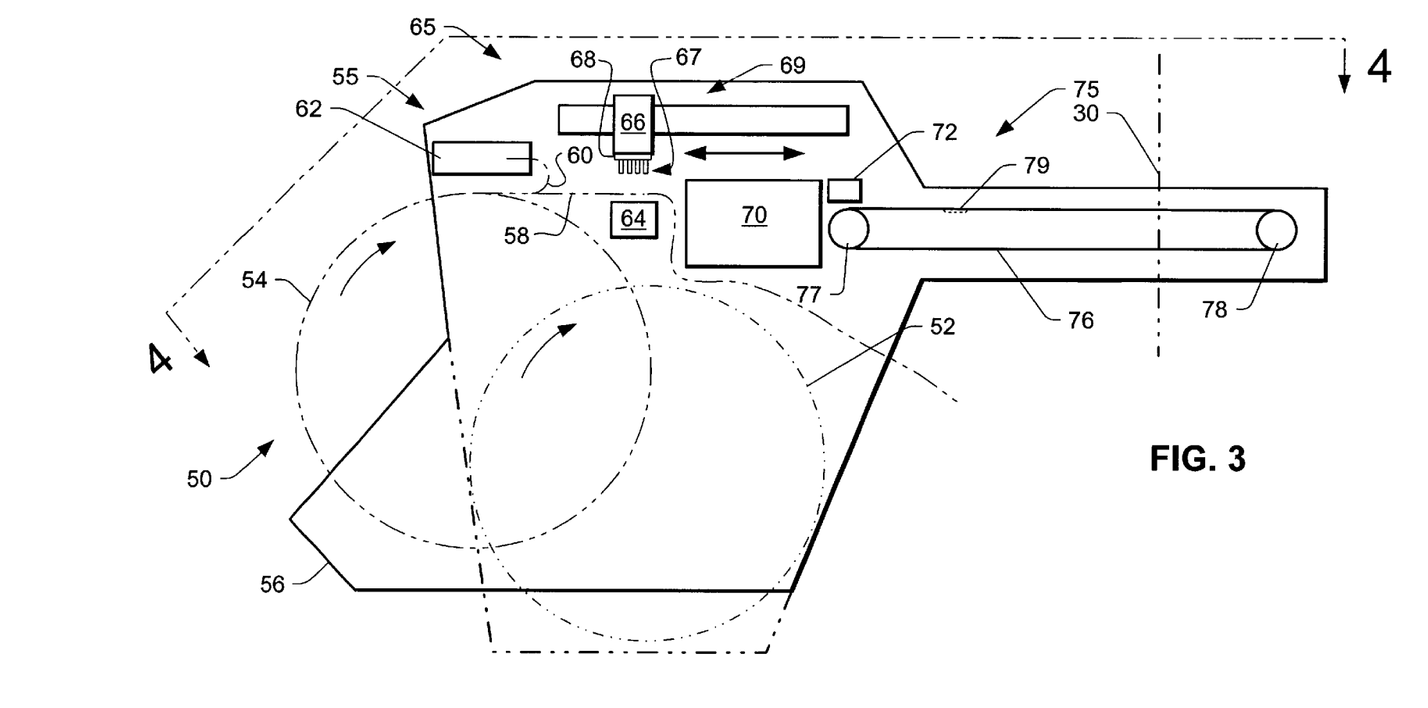
FIG. 3 is a side view of the feeder/programmer/buffer system of the present invention.

Referring now to FIG. 3, therein is shown one embodiment of a portion of the present invention, a feeder/programmer/buffer system 50, which is an in-line, linear operation system and which fits in the same place in the production assembly system 30 as one of the input feeders 34 or 36. The ability to fit the input feeder/programmer/buffer system 50 into roughly the same space and location as a feeder provides a new production assembly system which is capable of simplified, sustained high-speed processing and assembly operation.

A number of different input mechanisms may be used to feed the input feeder/programmer/buffer system 50 including a tube, tube stacker, tray, tray stacker, or a tape and reel as used with prior art systems. Due to the in-line configuration, the feeder/programmer/buffer system 50 is able to flexibly accommodate different feeding options with minimal changes. In the best mode, the feeder/programmer/buffer system 50 has an input mechanism which is a tape and reel feeder. The reel could be placed in a number of different positions such as underneath the feeder/programmer/buffer system 50 as indicated by an input reel 52, in front as indicated by an input reel 54, or be entirely separated from the feeder/programmer/buffer system 50 (not shown). Where the input reel 52 or 54 is part of the feeder/programmer/buffer system 50, it is supported by a frame 56 to allow rotation of the input reels 52 or 54 in a clockwise direction as shown in FIG. 3 by a drive mechanism (not shown) which could be a motor or a belt from another motor as will later be described.

Using input reel 54 as an example of an input feeder mechanism 55, unprogrammed devices are input between a carrier tape 58 and a cover tape 60. The carrier tape 58 has a plurality of small pockets for holding unprogrammed devices, or incorrectly programmed devices if reprogramming needs to be performed.

In the first stage, the cover tape 60 will be peeled off and fed to a cover tape mechanism 62, which handles disposal of the cover tape 60 by rolling it on to a spool or crushing it for later removal and disposal. The cover tape mechanism 62 applies tension to the cover tape 60 to assure that it is peeled off of the carrier tape 58. The peeling off of the cover tape 60 exposes the unprogrammed devices on the carrier tape 58.

An indexer or tape-in mechanism 64, which is part of the input feeder mechanism 55, includes a motor driven sprocket (not shown), which may include the previously described belt to rotate the input reel 52 or 54, to help pull the carrier tape 58 off the input reel 52 or 54 and bring the unprogrammed devices to a handling mechanism 65 which includes a PNP head 66 in a robotics handling system 69.

To have an elegantly simple system, the feeder/programmer/buffer system 50 is a linear operation system, and the robotics handling system 69 needs to only provide X-axis movement back and forth along the in-line length. The PNP head 66 contains one or more individual pickup mechanisms or probes 67 which provide vertical Z-axis movement for picking up the programmable devices. This in-line linear approach greatly simplifies overall operation of the feeder/programmer/buffer system 50 and reduces the overall size so that the feeder/programmer/buffer 50 can fit the desired minimum space profile.

To optimize throughput, the PNP head 66 has a plurality of probes 67 to pickup a plurality of unprogrammed devices sequentially. The number of unprogrammed devices picked up at one time will be a function of the speed of the feeder/programmer/buffer system 50. The more unprogrammed devices programmed in a single operation, the greater the throughput, but the larger the feeder/programmer/buffer system 50. Multiple unprogrammed devices could be picked up simultaneously if the center-to-center spacing of the micro devices as input did not change, but in the preferred embodiment, four unprogrammed devices are picked up sequentially.

The PNP head 66 could also incorporate a marking device 68, such as a stamp or ink pen, for marking the devices to indicate production lots or feeder/programmer/buffer used. As would be evident, the placement of the marking device is a matter of design.

Figure 4:
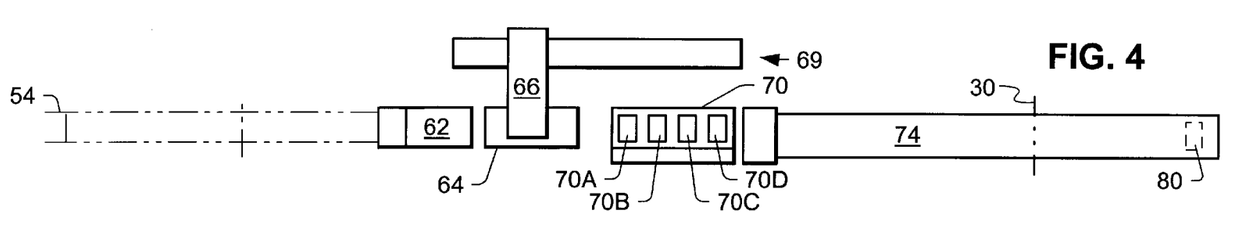
FIG. 4 is a top view of FIG. 3 taken along line 4—4.

Referring briefly to FIG. 4, therein is shown a top view of FIG. 3 along line 4—4. All the same elements as in FIG. 3 are designated by the same nomenclature and numbers as in FIG. 3. Of particular interest in FIG. 4, is a programming mechanism 70 showing four programmer socket locations 70A through 70D and the pickup area 80 at the far end of the feeder conveyor belt 74.

Referring now back to FIG. 3, therein is shown a side view of the programming mechanism 70. After the plurality of unprogrammed devices are picked up, they are moved by the robotics handling system 69 over to the programming mechanism 70 which has a plurality of sockets 70A through 70D into which the unprogrammed devices are sequentially placed by insertion or dropping by the probes 67 of the PNP head 66. Again, if the center-to-center spacing of the micro devices did not change, a simultaneous placement could be performed.

The unprogrammed devices are then programmed by the programming mechanism 70. The simultaneous programming can be accomplished just by connecting the plurality of sockets in parallel. The sequential programming can be accomplished by connecting the plurality of sockets separately or on a series bus. This multiplies the throughput of the present invention by a factor equal to the plurality of programmable devices being programmed over the prior art programming mechanisms. One additional feature in the programming mechanism 70 is the capability of identifying when a device cannot be programmed because it has failed processing or is "bad".

After the programming, the programmed devices may be extracted from the sockets by a number of different methods, but in the best mode, the PNP head 66 of the handling system 65 will perform sequential pickup. Again, if the center-to-center spacing of the micro devices did not change, a simultaneous extraction could be performed.

The PNP head 66 moves the bad programmable devices and deposits them in a reject in 72 and deposits the good programmed devices into an output buffer mechanism 75 which includes a buffer conveyor belt 76 which is on rollers 77 and 78. The buffer conveyor belt 76 is equipped with features for holding the programmable devices in place such as groves, pockets, or other holders, represented by pockets 79 (only one shown).

The buffer conveyor belt 76 moves the programmable devices to the pickup area 80 from where the robotic handling system which is part of the production assembly system 30, indicated by the phantom line in FIG. 3 and shown in FIG. 2 (PRIOR ART), will pick them up for population of the printed circuit boards. The buffer conveyor belt 76 can be speeded up or slowed down to accommodate the rate at which the programmed devices are required by the production assembly system and thus provide a reserve, or buffer, of programmed devices. The output buffer mechanism 75 may operate at different speeds from the remainder of the system because it is effectively uncoupled from the rest of the system and can provide programmed devices on demand. This creates a novel, new combination of a programmed product manufacturing system which includes the feeder/programmer/buffer system 50 and the production assembly system 30.

It should be noted that the programming could be performed such that the robotics handling system 69 and the PNP head 66 are in continuous operation picking and placing devices while other unprogrammed devices are being programmed by the programming mechanism 70. In the best mode, the PNP head 66 traverses to the pickup area of the tape-in mechanism 64, picks up four sequential programmable devices, sequentially places them into the sockets 70A through 70D in the programming mechanism 70, and waits until the programming is done. Then it picks up the programmable devices from the sockets 70A through 70D and places the bad parts in the reject bin 72 and the good parts on the buffer conveyor belt 76 which moves sufficiently to allow sequential placement of the programmed devices. The PNP head 66 then traverses back to the tape-in mechanism 64 to pickup four new programmable devices.

The carrier tape 58 is discarded through the feeder/programmer/buffer system 50. It should be understood that the carrier tape 58 moves at a different rate from the buffer conveyor belt 76 because the two parts are not coupled. The reason for this, in addition to the buffer function, is that there are periodic rejected programmable devices, which means that the input feed must be faster than the output feed.

Figure 5:
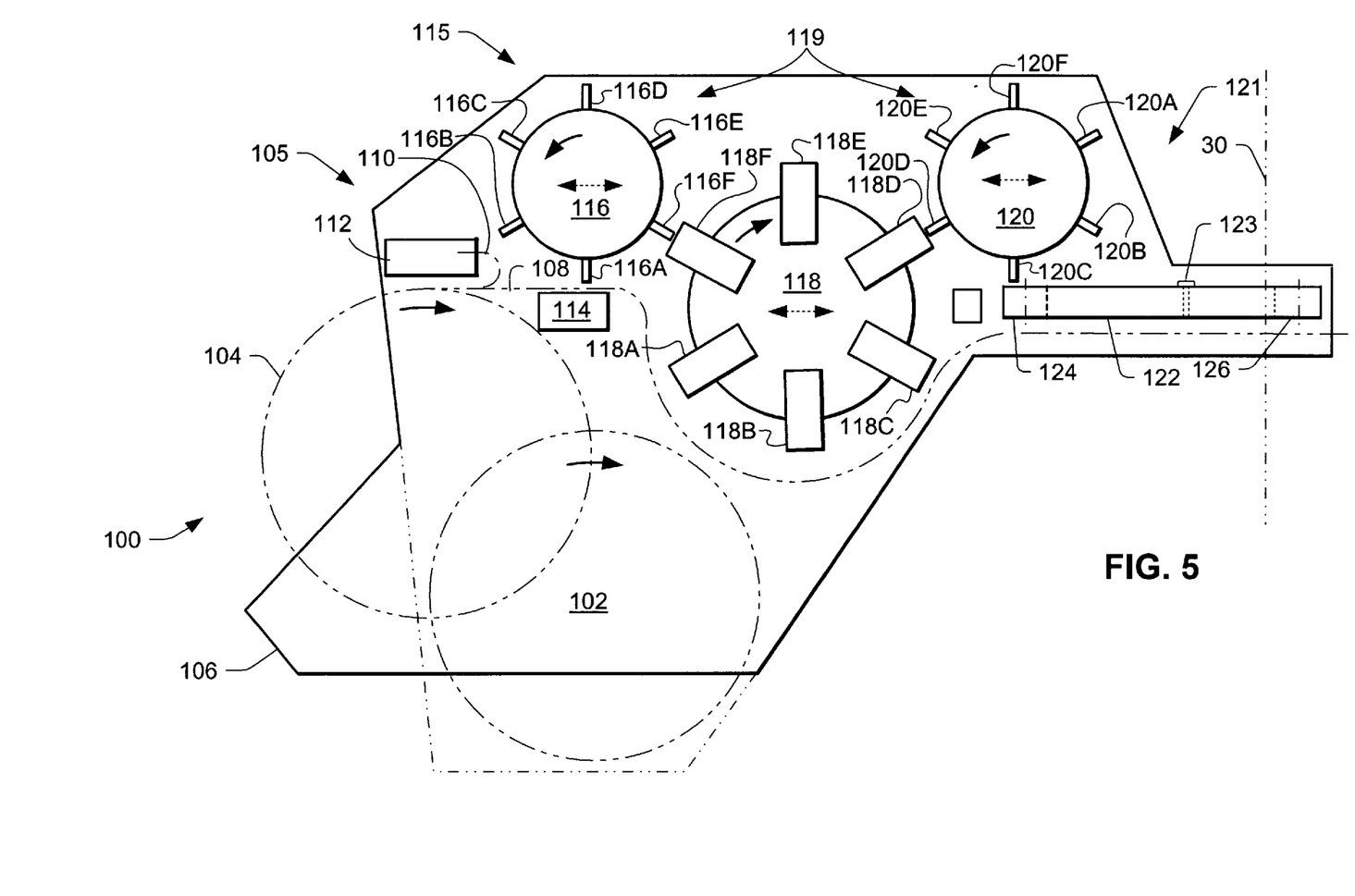
FIG. 5 is a side view of an alternative embodiment of the present invention.

Referring now to FIG. 5, therein is shown an alternate embodiment of a portion of the present invention, a feeder/programmer/buffer system 100 which is an in-line, rotary operation system and which fits in the same place in the production assembly system 30 of FIG. 2 as one of the input feeders 34 or 36. The ability to fit the feeder/programmer/buffer system 100 into the same space and location as a feeder provides a new production assembly system which is capable of simplified, sustained high-speed processing and assembly operation.

Just as for the feeder/programmer/buffer system 50, a number of different input mechanisms may be used to feed the feeder/programmer/buffer system 100 including a tube, tube stacker, tray, tray stacker, or a tape and reel. Due to the in-line configuration, the feeder/programmer/buffer system 100 is able to flexibly accommodate different feeding options with minimal changes. In the best mode, the feeder/programmer/buffer system 100 has an input feeder mechanism which is a tape feeder. The feeder/programmer/buffer system 100 shows two positions for input reels 102 and 104 in FIG. 5.

Using the input reel 104 as an example of an input feeder mechanism 105, a carrier tape 108 carrying the unprogrammed devices has a cover tape 110 which is peeled off and stored for disposal in a cover tape mechanism 112. The unprogrammed devices are moved by the carrier tape 108 into a tape-in mechanism 114 which is part of an input feeder mechanism 105 where a pick and place (PNP) rotor 116 picks the individual programmable devices up using pick and place (PNP) heads 116A through 116F. It would be understood that the number PNP heads is merely a matter of design for the feeder/programmer/buffer system 100. The PNP rotor 116 could also be designed to make X and/or Z traverses to improve pickup and placement.

The pickup rotor 116 rotates in a counter-clockwise direction to move the unprogrammed devices to a position where the PNP heads 116A through 116F can place the unprogrammed devices on a programmer rotor 118 which has a plurality of programmer heads 118A through 118F which correspond to the pickup rotor PNP heads 116A through 116F, although this again is merely a matter of design and the number of programmer heads and pickup rotor heads could be different.

The programmer rotor 118 rotates in a clockwise direction and programs the devices while rotating. When programming is complete, the programmed devices are removed by a place rotor 120 having PNP heads 120A through 120F which correspond with the programmer rotor PNP heads 118A through 118F, again with the number of heads being merely a matter of design. The programmer rotor 118 could also be designed to make X and/or Z traverses to improve pickup and placement.

The place rotor 120 picks the programmable devices from the programmer rotor heads 118A through 118F and, while rotating in a counter-clockwise direction, deposits the good programmed devices onto an output buffer mechanism 121. It would be understood that the place rotor 120 could be designed to make X and/or Z traverses to improve pickup and could also perform as an output buffer mechanism 121 itself by picking up programmed devices and shuttling back and forth in the X direction between the programmer rotor 118 and the handling system pick point.

Thus, the pickup rotor 116 and the place rotor 120 could be considered part of a handling mechanism 119 for the feeder/programmer/buffer system 100. The pickup rotor 116, the programmer rotor 118, and the place rotor 120 could also be considered part of a programming mechanism 115 or a combined programming and output buffer system.

In the best mode, however, the place rotor 120 properly positions the programmed devices in the output buffer mechanism 121 into the correct orientation for the robotic handling system 40 which is part of the production assembly system 30 to pick them up for population of the printed circuit boards 38 of FIG. 2 (PRIOR ART). The place rotor 120 places the programmed devices on to a sideways output buffer conveyor 122 which is on rollers 124 and 126 on vertical axes in the output buffer mechanism 121. The output buffer conveyor 122 could have grooves, pockets, or other holders on its edge which are exemplified by vacuum holders 123 (only one shown) which use a light vacuum to hold the programmed devices in place until they are picked up by the robotics handling system 40 at the pick point.

From the above it will be understood that the present invention is applicable to what can be described as "micro devices". Micro devices include a broad range of electronic and mechanical devices. The best mode describes processing which is programming for programmable devices, which include but are not limited to devices such as Flash memories (Flash), electrically erasable programmable read only memories (E$^2$PROM), programmable logic devices (PLDs), field programmable gate arrays (FPGAs), and microcontrollers. However, the present invention encompasses processing for all electronic, mechanical, hybrid, and other devices which require testing, measurement of device characteristics, calibration, and other processing operations. For example, these types of micro devices would include but not be limited to devices such as microprocessors, integrated circuits (ICs), application specific integrated circuits (ASICs), micro mechanical machines, micro-electromechanical (MEMs) devices, micro modules, and fluidic systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A micro device product manufacturing system comprising:
   a production assembly line capable of providing a product ready for incorporation of a processed micro device;
   an input feeder mechanism capable of providing an unprocessed micro device;
   a processing mechanism capable of receiving the unprocessed micro device from the input feeder mechanism and processing the micro device to produce a processed micro device;
   an output buffer mechanism capable of receiving the processed micro device from the processing mechanism and providing the processed micro device as required to the production assembly line; and
   a handling system capable of taking the processed micro device from the output buffer mechanism and incorporating the processed micro device into the product.

2. The micro device product manufacturing system as claimed in claim 1 wherein:
   the production assembly line moves in a first direction; and
   the input feeder, processing, and output buffer mechanisms are in a line with respect to each other, and the line is oriented at right angles to the first direction.

3. The micro device product manufacturing system as claimed in claim 1 wherein:
   the input feeder mechanism is capable of providing an unprocessed micro device in a feeder selected from a group consisting of a tray, tray stacker, tube, tube stacker, and tape and reel.

4. The micro device product manufacturing system as claimed in claim 1 wherein:
   the processing mechanism processes the micro device with a process selected from a group consisting of programming, calibration, test, and measurement.

5. The micro device product manufacturing system as claimed in claim 1 wherein:
   the processing mechanism processes a plurality of micro devices.

6. The micro device product manufacturing system as claimed in claim 1 wherein:
   the processing mechanism includes a mechanism for detecting and rejecting failed micro devices after processing.

7. The micro device product manufacturing system as claimed in claim 1 including:
   a handling mechanism for moving micro devices among the input feeder, processing, and output buffer mechanisms in a linear direction.

8. The micro device product manufacturing system as claimed in claim 1 wherein:
   the input feeder, processing, and output buffer mechanisms are in line; and including
   a handling mechanism for moving micro devices among the input feeder, processing, and output buffer mechanisms in line using rotary movements.

9. A micro device feeder/processing/buffer system for a production assembly line comprising:
   an input feeder mechanism capable of providing an unprocessed micro device;
   a processing mechanism capable of receiving the unprocessed micro device from the input feeder mechanism and processing the micro device to produce a processed micro device; and
   an output buffer mechanism capable of receiving the processed micro device from the processing mechanism and providing the processed micro device as required to the production assembly line.

10. The micro device feeder/processing/buffer system as claimed in claim 9 wherein:
    the input feeder, processing, and output buffer mechanisms are in line.

11. The micro device feeder/processing/buffer system as claimed in claim 9 wherein:
    the input feeder mechanism is capable of providing an unprocessed micro device in a feeder selected from a group consisting of a tray, tray stacker, tube, tube stacker, and tape and reel.

12. The micro device feeder/processing/buffer system as claimed in claim 9 wherein:

the processing mechanism processes the micro device with a process selected from a group consisting of programming, calibration, test, and measurement.

13. The micro device feeder/processing/buffer system as claimed in claim 9 wherein:

the processing mechanism processes a plurality of micro devices.

14. The micro device feeder/processing/buffer system as claimed in claim 9 wherein:

the processing mechanism includes a mechanism for detecting and rejecting failed micro devices after processing.

15. The micro device feeder/processing/buffer system as claimed in claim 9 including:

a handling mechanism for moving micro devices among the input feeder, processing, and output buffer mechanisms in a linear direction.

16. The micro device feeder/processing/buffer system as claimed in claim 9 wherein:

the input feeder, processing, and output buffer mechanisms are in line; and including
a handling mechanism for moving micro devices among the input feeder, processing, and output buffer mechanisms in line using rotary movements.

17. A circuit board assembly system comprising:

a production assembly line capable of providing a circuit board ready for incorporation of a programmed electronic device;

an input feeder mechanism capable of providing an unprogrammed electronic device;

a programming mechanism capable of receiving the unprogrammed electronic device from the input feeder mechanism and programming the electronic device to produce a programmed electronic device;

an output buffer mechanism capable of receiving the programmed electronic device from the programming mechanism and providing the programmed electronic device as required to the production assembly line; and a handling system capable of taking the programmed electronic device from the output buffer mechanism and incorporating the programmed electronic device into the product.

18. The circuit board assembly system as claimed in claim 17 wherein:

the production assembly line moves in a first direction; and the input feeder, programming, and output buffer mechanisms are in a line with respect to each other, and the line is oriented at right angles to the first direction.

19. The circuit board assembly system as claimed in claim 17 wherein:

the input feeder mechanism is capable of providing an unprogrammed electronic device in a feeder selected from a group consisting of a tray, tray stacker, tube, tube stacker, and tape and reel.

20. The circuit board assembly system as claimed in claim 17 wherein:

the programming mechanism processes a plurality of electronic devices.

21. The circuit board assembly system as claimed in claim 17 wherein:

the programming mechanism includes a mechanism for detecting and rejecting failed electronic devices after programming.

22. The circuit board assembly system as claimed in claim 17 wherein:

the output buffer mechanism is capable of operating substantially independently from the programming mechanism.

23. The circuit board assembly system as claimed in claim 17 including:

a handling mechanism for moving electronic devices among the input feeder, programming, and output buffer mechanisms in a linear direction.

24. The circuit board assembly system as claimed in claim 17 including:

a handling mechanism for moving electronic devices among the input feeder, programming, and output buffer mechanisms including a robotics mechanism for moving electronic devices in a horizontal linear direction and a pick and place mechanism-for moving electronic devices in a vertical direction.

25. The circuit board assembly system as claimed in claim 17 wherein:

the input feeder, programming, and output buffer mechanisms are in line; and including
a handling mechanism for moving electronic devices among the input feeder, programming, and output buffer mechanisms in line using rotary movements.

26. The circuit board assembly system as claimed in claim 17 wherein: the output buffer mechanism includes a conveyer.

27. An electronic device feeder/programming/buffer system for a production assembly line comprising:

an input feeder mechanism capable of providing an unprogrammed electronic device;

a programming mechanism capable of receiving the unprogrammed electronic device from the input feeder mechanism and programming the electronic device to produce a programmed electronic device; and an output buffer mechanism capable of receiving the programmed electronic device from the programming mechanism and providing the programmed electronic device as required to the production assembly line.

28. The electronic device feeder/programming/buffer system as claimed in claim 27 wherein:

the input feeder, programming, and output buffer mechanisms are in line.

29. The electronic device feeder/programming/buffer system as claimed in claim 27 wherein:

the input feeder mechanism includes feeder means for providing an unprogrammed electronic device.

30. The electronic device feeder/programming/buffer system as claimed in claim 27 wherein:

the programming mechanism programs a plurality of electronic devices.

31. The electronic device feeder/programming/buffer system as claimed in claim 27 wherein:

the programming mechanism includes a mechanism for detecting and rejecting unprogrammed electronic devices after programming.

32. The electronic device feeder/programming/buffer system as claimed in claim 27 including:

a handling mechanism for moving electronic devices among the input feeder, programming, and output buffer mechanisms in a linear direction.

33. The electronic device feeder/programming/buffer system as claimed in claim 27 including:

a handling mechanism for moving electronic devices among the input feeder, programming, and output buffer mechanisms including a robotics mechanism for moving electronic devices in a horizontal linear direction and a pick and place mechanism for moving electronic devices in a vertical direction.

34. The electronic device feeder/programming/buffer system as claimed in claim 27 wherein:

the input feeder, programming, and output buffer mechanisms are in line; and including a handling mechanism for moving electronic devices among the input feeder, programming, and output buffer mechanisms in line using rotary movements.

35. The electronic device feeder/programming/buffer system as claimed in claim 27 wherein:

the output buffer mechanism includes a conveyer having means for holding the programmed electronic devices.

36. The electronic device feeder/programming/buffer system as claimed in claim 27 wherein:

the output buffer mechanism is capable of operating substantially independently from the input feeder mechanism and the programming mechanism.

\* \* \* \* \*